FREQUENCY-STABILIZED LOW FREQUENCY OSCILLATOR

Filed Sept. 27, 1967 5 Sheets-Sheet 1

INVENTOR
STANLEY B. FREEMAN
BY Jameson and Franklin
ATTORNEYS

INVENTOR
STANLEY B. FREEDMAN
BY Jones and Franklin
ATTORNEYS

INVENTOR
STANLEY B. FREEMAN
BY James and Franklin
ATTORNEYS

FREQUENCY-STABILIZED LOW FREQUENCY OSCILLATOR

Filed Sept. 27, 1967

INVENTOR

STANLEY B. FREEMAN

BY James and Franklin

ATTORNEYS

Sept. 23, 1969 S. B. FREEDMAN 3,469,210

FREQUENCY-STABILIZED LOW FREQUENCY OSCILLATOR

Filed Sept. 27, 1967 5 Sheets-Sheet 5

INVENTOR
STANLEY B. FREEMAN

BY James and Franklin
ATTORNEYS 3,469,210

FREQUENCY-STABILIZED LOW FREQUENCY OSCILLATOR

Stanley B. Freeman, Jericho, N.Y., assignor to General Instrument Corporation, a corporation of Delaware Filed Sept. 27, 1967, Ser. No. 670,896
Int. Cl. H03k 3/28
U.S. Cl. 331—113 35 Claims

ABSTRACT OF THE DISCLOSURE

A low frequency oscillator of the multivibrator type having a pair of electronic valves interconnected so as to be alternately conductive, in which the circuit constants and the interconnection between the control electrodes of the two valves are such as to control the periods of conductivity and nonconductivity of individual valves as the supply voltage varies so that the frequency of operation of the circuit is substantially constant with variations in supply voltage.

The present invention relates to a multivibrator oscillator the frequency of operation of which is substantially insensitive to variations in the supply voltage.

Oscillators of the multivibrator type are well known, and are particularly useful where relatively low frequencies, up to several kilohertz, are involved. These circuits generally comprise a pair of parallel-connected electronic valves such as transistors which are interconnected in such a fashion that first one and then the other of the valves is rendered conductive, the attainment of a conductive status by a given acting to render the other valve nonconductive, the nonconductive valve, after a period of time, becoming conductive and rendering the other valve nonconductive, and so on. While circuits of this type are widely used in many applications, such as electronic time fuses, laboratory sweep circuits, digital electronic timing and programming devices, and the like, they suffer from the drawback that their frequency of operation is appreciably sensitive to the supply voltage. Thus their use where a constant and accurate frequency is called for requires a power supply the output voltage of which is accurately maintained at proper value.

It is the prime object of the present invention to devise a free-running monostable multivibrator circuit the frequency of operation of which is maintained substantially at nominal value even though the supply voltage may vary radically.

A further prime object of the present invention is to devise constant-frequency circuitry of the type in question which can readily be incorporated into integrated circuit constructions, and which can therefore be fabricated relatively inexpensively and which function with a high degree of reliability.

In the basic multivibrator circuit the frequency of oscillation is determined by the voltage variations at the control electrode of one of the valves, that voltage having two stages of variation during each cycle of operation. In the first stage of operation the voltage causes the valve to be nonconductive and in the second stage it causes the valve to be conductive, the valve shifting between nonconductive and conductive conditions at a nominal control electrode voltage generally known as the threshold voltage. The period of oscillation is determined by the sum of the times involved in the two cyclical stages in question.

In the normal circuit a change in supply voltage causes comparatively radical variation in the voltage changes to which the said control electrode is subjected, particularly insofar as its conductive stage is concerned, with an increase in supply voltage giving rise to an increase in the period, and hence a decrease in the frequency, of the circuit output. In addition, change in the supply voltage may give rise to a smaller but nevertheless significant change in the threshold voltage for the valve in question. The variation in the threshold voltage may act on frequency in the opposite sense from that previously described, particularly when the transistors are defined by metal oxide semiconductor (MOS) field effect transistors, but not in a controlled or predetermined sense, and hence the resultant frequency varies with changes in the magnitude of the voltage supply.

In accordance with the present invention the circuitry is so modified as to produce voltage changes at the said control electrode which are controlled or predetermined, to greater or lesser extent in the first or nonconductive and the second or conductive stages of the voltage cycle, to the end that a given change in supply voltage will affect one or both of the stages, but in a fashion such that any increase in the time involved in the first stage will be offset, wholly or substantially, by a corresponding decrease in the time involved for the second stage. Where less accuracy is required a simpler circuit may be employed which permits variation in the time involved in the first stage as the supply voltage varies, said variation being sufficiently small so as not to be appreciable in view of the degree of accuracy required, while retaining the time involved for the second stage substantially constant, the latter time being a relatively large multiple of the former time so that the overall accuracy is kept within desired bounds.

The nature of the voltage variation at the control electrode in question, during each cyclical stage, is such that the voltage virtually instantaneously reaches a value remote from the threshold voltage and then comparatively gradually approaches the threshold voltage, at a rate determined by the circuit constants and the supply voltage. Normally the threshold-approaching portion of each stage is exponential in shape. A major step toward achieving a high degree of accuracy in frequency stabilization is taken by so modifying the circuits that the movements of the voltage toward the threshold value are linearized or substantially so. By this linearization much greater possibility of accurate control is realized. The gradual change in the voltage during the nonconducting cycle can be linearized simply by making the time duration of that cyclical stage very short. Linearization of the voltage change during the conductive stage of the cycle can be achieved by providing a capacitor between the control electrode in question and one of the output electrodes of the other valves and charging that capacitor, during the conductive cyclical stage of the valve in question, through an appropriately controlled constant current source.

According to one high precision approach, the rate at which the control electrode voltage rises during the conductive stage is matched to the rate at which the said voltage falls during the nonconductive stage, while preferably at the same time limiting the maximum excursion of the voltage from a reference value at the beginning of the conductive stage to a value corresponding to the supply voltage but substantially independent of any variations in the threshold voltage. This may readily be done with simple circuitry when the voltage variations at the control electrode are linear or substantially so, and the result is that when the voltage increases so as to cause the first or non-conductive stage to take a shorter period of time, the second or conductive stage is caused to take a correspondingly longer period of time, changes in the threshold voltage affecting each cyclical stage inversely to the same degree, thereby to produce an overall period of oscillation which is substantially constant.

In a simpler but less rigorous approach the rate at which the control electrode voltage rises during the conductive stage is maintained substantially constant and linear and the maximum excursion from the threshold value of the voltage during this stage is maintained substantially constant, thereby ensuring that the time duration of the second cyclical stage will remain substantially constant. If through proper circuit design the length of time involved for the second cyclical stage is made many times more than that invloved for the first cyclical stage, such variations as may be involved in the time duration of the first stage as a result of supply voltage variations will be minimal and will not significantly affect the overall frequency of the circuit.

In accordance with the present invention stable oscillator circuits can be produced having frequencies between one-quarter hertz and several kilohertz in which frequency accuracy at least as good at 0.2%, and usually better than 0.1%, is achieved, with supply voltage variations of 60% of nominal value (30% to either side of nominal).

To the accomplishment of the above, and to such other objects as may hereinafter appear, the present invention relates to the design of substantially constant-frequency multivibrator circuits as defined in the appended claims and as described in this specification, taken together with the accompanying drawings, in which:

Figure 4A:
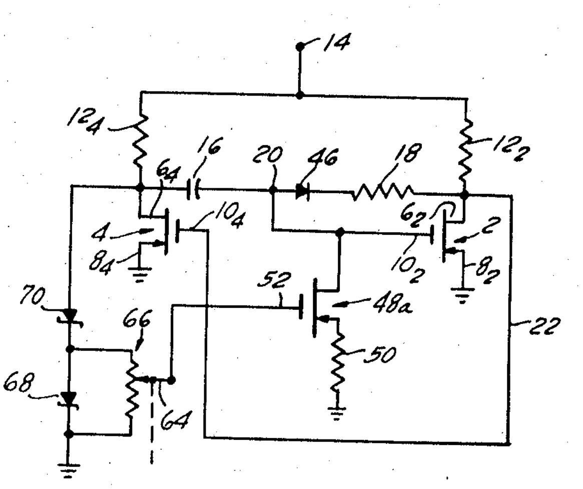
FIG. 4A is a circuit diagram of a third embodiment of the present invention.
Figures 4B, 5:
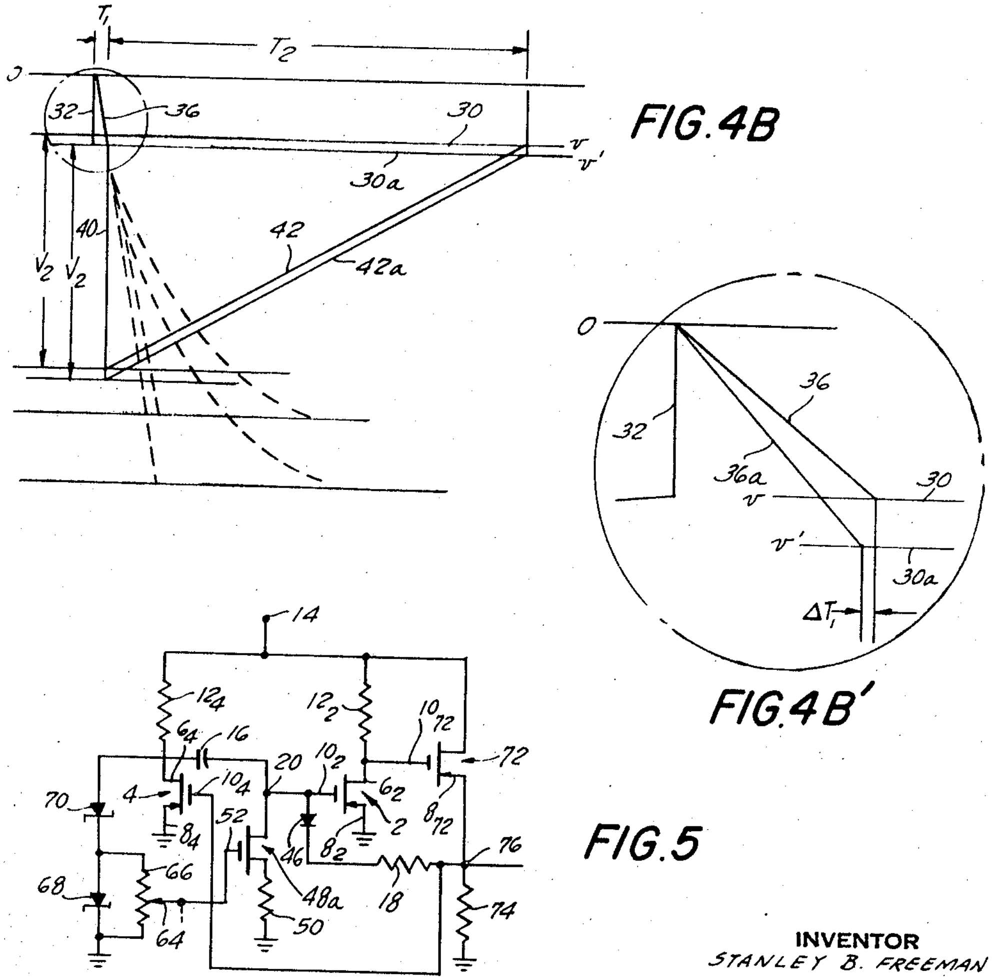
FIG. 4B is a diagram similar to FIG. 3B but relating to the circuit of FIG. 4A.
Figure 6A:
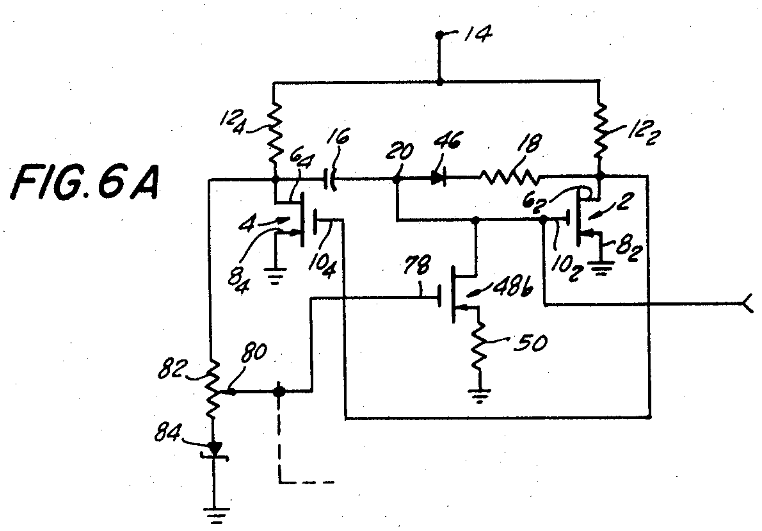
Figure 6B:
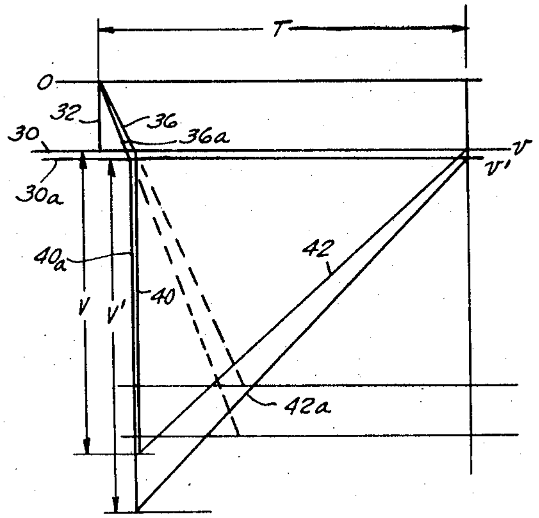

FIG. 4B[1] is a graphical representation, on an enlarged scale, of that portion of FIG. 4B enclosed within the dot-dash circle;

FIG. 5 is a circuit diagram of a variant of the circuit of FIG. 4A;

FIG. 6A is a circuit diagram of yet another embodiment of the present invention; and FIG. 6B is a diagram similar to FIG. 4B but relating to the circuit of FIG. 6A.

In all diagrams the MOS substrate connection has been omitted for purposes of clarity. It is understood that the substrate connections are grounded in the configurations depicted.

Figure 1A:
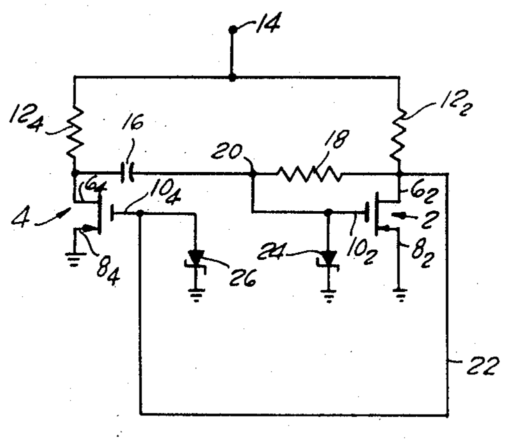
FIG. 1A PRIOR ART
FIG. 1A is a circuit diagram of a typical monostable multivibrator circuit of the prior art.

The basic elements of a typical free-running monostable multivibrator circuit are shown in FIG. 1A. The circuit comprises a pair of electronic valves generally designated 2 and 4 and here shown as field effect transistors of the MOS type having drain and source output electrodes $\mathbf{6}_2$, $\mathbf{8}_2$ and $\mathbf{6}_4$ and $\mathbf{8}_4$, respectively, and having control electrodes $\mathbf{10}_2$ and $\mathbf{10}_4$ respectively. The source electrodes $\mathbf{8}_2$ and $\mathbf{8}_4$ are each connected to ground or any other source of reference potential. The drain electrodes $\mathbf{6}_2$ and $\mathbf{6}_4$ are connected via resistors $\mathbf{12}_2$ and $\mathbf{12}_4$, respectively, to a negative voltage source 14. A capacitor 16 and a resistor 18 are connected in series between the drain electrodes $\mathbf{6}_2$ and $\mathbf{6}_4$ and a point 20 between them is connected to the gate electrode $\mathbf{10}_2$. The gate electrode $\mathbf{10}_4$ is connected by lead 22 to the drain electrode $\mathbf{6}_2$. Protective Zener diodes 24 and 26 are connected between the gate electrode $\mathbf{10}_2$ and $\mathbf{10}_4$ respectively and ground in order to eliminate the detrimental effects of high electrostatic voltage on the gate electrodes which might come about in normal use.

Figure 1B:
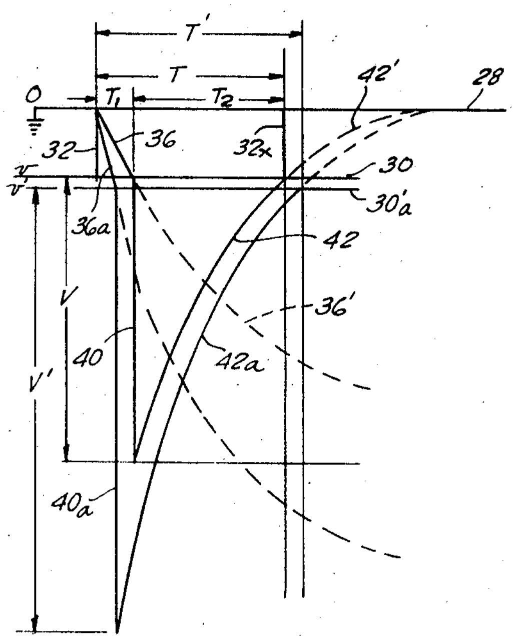
FIG. 1B PRIOR ART
FIG. 1B is a graphical representation of the voltage-time relationship at the control electrode of the right hand electronic valve of FIG. 1A during a cycle of operation of the circuit, FIG. 1B illustrating the voltage values corresponding to two different values of supply voltage.
Figure 1C:
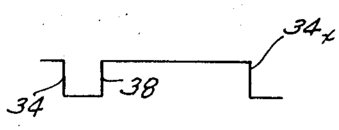
FIG. 1C is a diagram, on the same time scale as FIG. 1B, showing the voltage-time relationship at the output electrode of the right hand electronic valve of FIG. 1A.

The functioning of the circuit of FIG. 1A for a given supply voltage V can perhaps best be understood by reference to FIGS. 1B and 1C, FIG. 1B representing graphically the voltage at gate electrode $\mathbf{10}_2$ with reference to time and FIG. 1C graphically representing the voltage at the drain electrode $\mathbf{6}_2$ with respect to time. In FIG. 1B the horizontal ilne 28 represents zero or reference voltage and the horizontal line 30 represents the threshold voltage $v$ for the gate electrode $\mathbf{10}_2$ when the supply voltage is V.

When the supply voltage 14 is connected to the circuit, its negative voltage —V will be applied to the gate electrode $\mathbf{10}_4$ via resistor $\mathbf{12}_2$ and lead 22, rendering the transistor 4 conductive and thus bringing its drain $\mathbf{6}_4$ to zero or ground potential. The capacitor 16 will transmit that potential to the gate $\mathbf{10}_2$, as indicated by the line 32 in FIG. 1B, thus rendering the valve 2 nonconductive. The voltage of drain $\mathbf{6}_2$ becomes negative, as indicated in line 34 in FIG. 1C, thus ensuring that gate $\mathbf{10}_4$ is negative and transistor 4 is fully conductive. Since resistor 18 connects drain $\mathbf{6}_2$ to gate $\mathbf{10}_2$, the latter will tend to assume the voltage of the former, as indicated by the line 36 on FIG. 1B. Such a potential change involves a charging of capacitor 16 and hence, as indicated by the solid line 36 and its broken line extension 36', the change in voltage at gate $\mathbf{10}_2$ will occur exponentially, controlled by a time constant determined by the values of resistors $\mathbf{12}_2$ and 18 and the capacitor 16. When the voltage of gate $\mathbf{10}_2$ decreases sufficiently to reach the threshold value $v$ represented by the line 30, the valve 2 will become conductive. At this point drain $\mathbf{6}_2$ will move back up to ground potential, as indicated by the line 38 in FIG. 1C, gate $\mathbf{10}_4$ will come to ground potential, transistor 4 will become nonconductive, drain $\mathbf{6}_4$ will drop to supply voltage potential, and this voltage will be transmitted by capacitor 16 to gate $\mathbf{10}_2$, driving it down to a negative voltage which is the sum of $v$ and V (see line 40 of FIG. 1B). Since gate $\mathbf{10}_2$ is now at a voltage below drain $\mathbf{6}_2$ to which it is connected by resistor 18, the gate voltage will tend to rise toward the drain voltage, but again this involves the charging of capacitor 16 and hence the rise in voltage will occur exponentially, as indicated by the solid line 42 and the broken line 42' of FIG. 1B. When the voltage reaches the threshold value $v$ represented by line 30 the transistor 2 will become nonconductive, drain $\mathbf{6}_2$ will shift to a negative value, as indicated by the line 34$x$ on FIG. 1C, transistor 4 will again become conductive, the voltage at gate $\mathbf{10}_2$ will again rise to zero volts, as indicated in the line 32$x$ in FIG. 1B, and the cycle will repeat. The total time T of the cycle is determined by the time involved in the first cyclical stage when transistor 4 is conductive and transistor 2 is nonconductive ($T_1$ in FIG. 1B), and by the time involved in the second cyclical stage when transistor 2 is conductive and transistor 4 is nonconductive ($T_2$ in FIG. 1B).

If the supply voltage is increased to a value V' the threshold value $v'$ for the transistor 2 will be reduced somewhat, to the value represented by the line 30$a$. Because of the increased voltage the rate at which the capacitor 16 will charge will be greater, and hence the slope of line 36a in FIG. 1B, similar to line 36 but representing the situation with the supply voltage V′, will be greater than that of line 36. Hence the value $T_1$ with this greater supply voltage will be less than formerly. The greater value of supply voltage will cause the line 40a (corresponding to the line 40 but for a higher supply voltage) to move down much farther than the line 40, by a distance corresponding both to the excess of V′ over V and the excess of threshold voltage v′ over v. Although the increased supply voltage will again cause the capacitor 16 to change more rapidly than in the previous case, so that the line 42a initially rises somewhat more steeply than the line 42, the net result will be that the line 42 will reach the new threshold value 30a at a later time than the line 42 reached its corresponding threshold voltage line 30. Hence the time T′ for the entire cyclical period with increased voltage will be greater than the time T with the lower supply voltage, and hence the frequency of operation of the system will be less as the supply voltage increases.

Figure 2A:
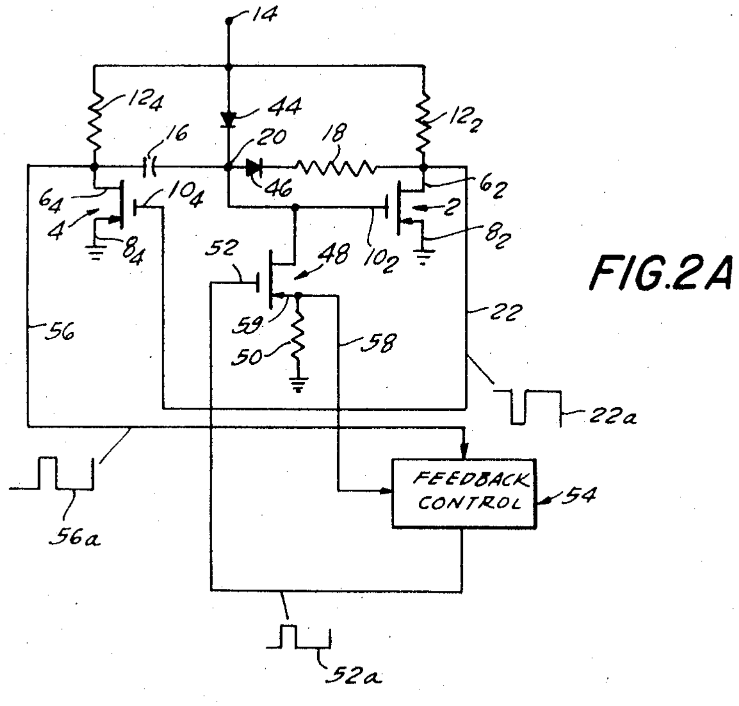
FIG. 2A is a circuit diagram of a first embodiment of the present invention.
Figure 2B:
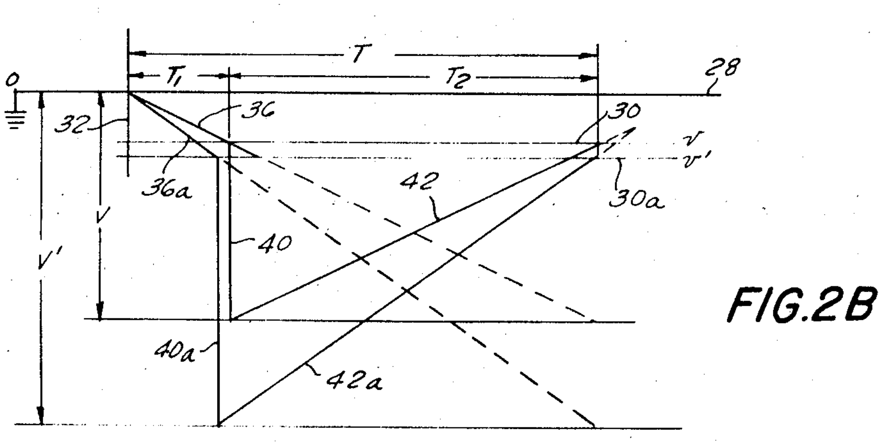
FIG. 2B is a diagram similar to FIG. 1B but showing the voltage-time relationships at the control electrode of the circuit of FIG. 2A under two different supply voltage conditions.

FIG. 2 discloses a first circuit embodiment utilizing the same basic oscillator circuit as in FIG. 1A, similar parts being given similar reference numerals, but modified in accordance with the present invention so as to produce a mode of operation in which the frequency of operation is substantially constant as the supply voltage 14 varies. FIG. 2B corresponds to FIG. 1B but represents the voltage-time relationships for the circuit of FIG. 2A.

The protective Zener diodes 24 and 26 of FIG. 1A have been omitted from FIG. 2A for purposes of clarity, and this has also been done in the succeeding circuit diagram figures.

Figure 2C:
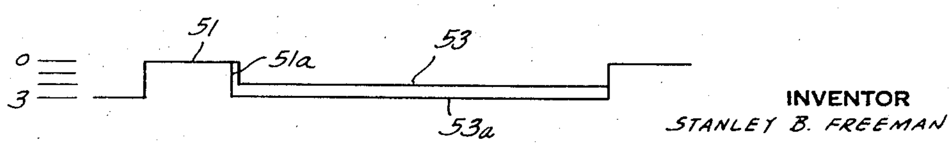
FIG. 2C is a graphical representation of the voltage-time relationship of the source electrode for the constant current device in the circuit of FIG. 2A.

In the circuit of FIG. 2A a rectifier 44 is connected between the voltage source 14 and the point 20 and a rectifier 46 is connected between the point 20 and resistor 18, both poled as shown. In addition, a constant current source 48 is connected between point 20 and ground via resistor 50, the control gate 52 thereof being connected to a feedback control circuit generally designated 54 which has two inputs, one defined by lead 56 connected to drain $6_4$ and the other defined by lead 58 connected to the upper end of resistor 50 and to source electrode 59 of transistor 48. The voltages on the lines 22 and 56 and the voltage at the gate 52 of the constant current source 48 are all shown on FIG. 2A and designated 22a, 56a and 52a respectively. FIG. 2C represents the voltage-time relationship of the voltage at lead 58, which is also the voltage of the source electrode 59.

In the circuit of FIG. 2A, and with the supply voltage at a value V, application of the supply voltage to the terminal 14 causes transistor 4 to become conductive and transistor 2 to become nonconductive as described previously. Hence the voltage at gate $10_2$ rises to zero volts as indicated by the line 32 in FIG. 2B. With the gate $10_2$ at zero volts and the drain $6_2$ at −V the diode 46 will be forward biased and the voltage at gate $10_2$ will charge exponently toward −V with a time constant determined essentially by the resistor 18 and the capacitor 16 (the drain resistor $12_2$ preferably being made small compared with the resistor 18), the slope of line 36, for a given set of circuit parameters, being determined by the supply voltage V. The voltage at gate $10_2$ is represented by the line 36. During the time that the voltage at gate $10_2$ is thus charging, the transistor 48 is cut off, since it derives its gate control voltage from drain $6_4$, which is at zero volts. Hence the source electrode 59 is at zero potential, as indicated by line 51 of FIG. 2C.

When the line 36 meets the threshold voltage value 30 transistor 2 becomes conductive and transistor 4 becomes nonconductive as before. Hence the drain $6_4$ assumes a voltage of −V, and this is transmitted by capacitor 16 to gate $10_2$, as indicated by the line 40. The diode 44 clamps the voltage at point 20, and hence the voltage of the gate $10_2$, to −V.

Although, as has been indicated, the charging of the voltage at gate $10_2$ toward −V is exponental, the line 36 in FIG. 2B is essentially linear provided that the threshold voltage 30 is reached quickly, before the exponental curve becomes very curved. Essentially linearity of the line 36 may be achieved if the supply voltage V is greater than about five times the threshold voltage v.

Once the transistor 2 becomes conductive, with the drain $6_2$ going to ground potential while the gate $10_2$ becomes strongly negative, the diode 46 becomes back-biased, and hence the capacitor 16 cannot charge through the resistor 18. Charging current for the capacitor 16 is provided, however, by the constant current source 48, the feedback control circuit 54 now being appropriately energized by line 56 through a negative voltage created when the transistor 4 became nonconductive and consequently applying a predetermined proportion of that negative voltage to the gate 52 of the current source 48 so as to produce a constant current of desired value. While this current flows the voltage at source electrode 59, and hence lead 58, will be as indicated by line 53 in FIG. 2C. In the circuitry here specifically under discussion, it is desired that the amount of charging current provided to the capacitor 16 be such as to make the slope of the line 42 the same as but opposite in sign from, the slope of the line 36. To put the matter in other words, the charging current furnished by the current source 48 during the second cyclical stage should be equal to the charging current provided during the first cyclical stage. In the circuitry here disclosed this result is achieved by means of the control lead 58, which monitors the voltage across resistor 50 (which is in turn a function of the amount of charging current being provided) and compares that voltage with a divided sample of the supply voltage as derived from the line 56. The difference voltage is appropriately amplified and fed back to the gate 52 to maintain constant the slope of the line 42 and to null any difference voltage between that on line 58 and the predetermined proportion on that of line 56. Hence the line 42, representing the rise of voltage at gate $10_2$ during the second cyclical stage, is rendered linear, and its slope is matched to that of the line 36.

The effect of these factors can be appreciated by examining lines 36a, 40a and 42a of FIG. 2B and the lines 51a and 53a of FIG. 2C, which respectively represent the voltage-time relationships of the voltage at gate $10_2$ and source 59 when a greater voltage V′ is applied. Because of the greater supply voltage the slope of line 36a is greater than the line 36, so that the duration $T_1$ of the first cyclical stage is reduced. Because V′ is greater than V, the line 40a goes down to a lower point than the line 40, but the degree to which it thus goes down is rigidly controlled by the magnitude of V′ (because of the clamping effect of the rectifier 44). Although the line 40a goes down to a lower point than the line 40, the line 42a has a greater slope than the line 42 because the supply voltage V′ is greater, and the slope of line 42a matches that of line 36a, just as the slope of line 36 matched that of line 42. Hence line 42a will intersect the threshold voltage line 30a at the same time that the line 42 intersected its corresponding threshold voltage line 30. As a result, although $T_1$ was decreased and $T_2$ was increased with increased voltage, the overall value T remains the same. In other words, the frequency of operation of the circuit is rendered substantially insensitive to variations in supply voltage. In a particular circuit of the type disclosed in FIG. 2A, with a 30-volt nominal supply voltage, frequency stability of better than 0.1% was measured over a + or −10 volt supply voltage variation at an oscillator frequency of 10 cycles per second.

It should be noted in connection with the circuit of FIG. 2A and the graphical analysis thereof in FIGS. 2B and 2C that frequency stability is attained whether or not the threshold voltage varies with the supply voltage.

Figure 3A:
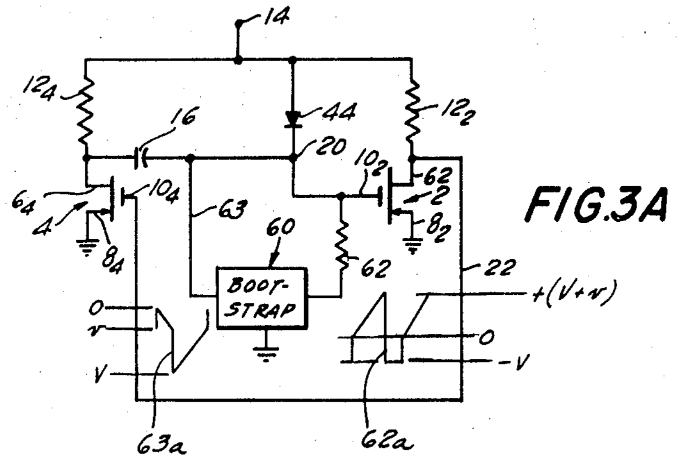
FIG. 3A is a circuit diagram of a second embodiment of the present invention.
Figure 3B:
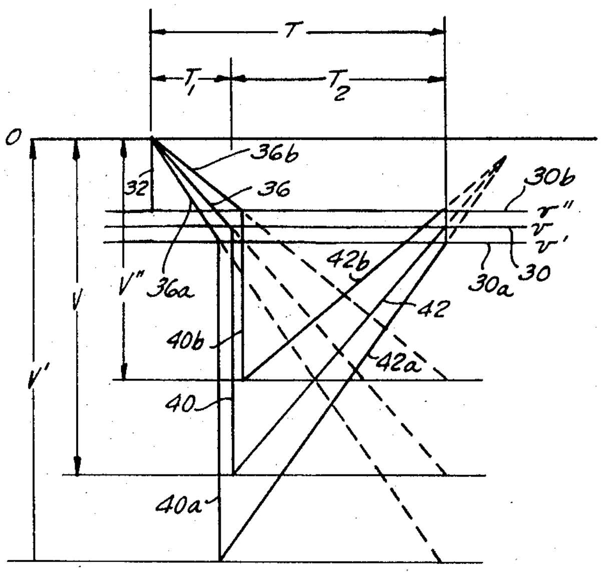
FIG. 3B is a diagram similar to FIG. 2B but relating to the circuit of FIG. 3A.

The circuit of FIG. 3A is essentially the same as that of FIG. 2A, except that a different mode of providing constant charging current for the capacitor 16 is provided, that means in FIG. 3A being constituted by a bootstrap circuit generally designated 60. Various types of bootstrap circuits are known, and the specific details thereof form no part of the present invention. Hence the circuit is shown in block diagram form. The circuit 60 is connected between the gate $10_2$ and the capacitor 16 via resistor 62 on its output side and lead 63 on its input side. It has the characteristic of sensing the voltage at capacitor 16 and varying the charging effect so as to produce a constant charging current. Since the circuit 60 as shown functions both for discharge and charge of the capacitor 16, the rectifier 46 of the circuit of FIG. 2A is not required. However, the rectifier 44 is still present, thus clamping the gate $10_2$ to the supply voltage at appropriate times and hence limiting the negative excursion of the voltage at gate $10_2$ to the supply voltage. The voltage at lead 63, and hence at gate $10_2$, is shown in FIG. 3A by line *63a*, and is shown more in detail in FIG. 3B. The line *62a* in FIG. 3A represents the voltage at the output of the bootstrap circuit 60. As may be seen from FIG. 3B, which represents the voltage-time relationship of the voltage at gate $10_2$ for three different values of supply voltage V, V′ and V″ for the circuitry of FIG. 3A, substantially constant frequency is achieved with variation in supply voltage.

It will be noted in connection with the circuits of FIGS. 2 and 3 that the slope of the lines 36 is maintained essentially linear, this being conveniently accomplished by virtue of using a large supply voltage and a small threshold voltage, that the gate $10_2$ is clamped to the supply voltage source, thereby to ensure that the matched slopes of the two linear waveforms charge toward equal potentials, and that the positive-moving waveform during the second cyclical stage is linearized and has a slope corresponding to that of the line 36. These conditions appear to give the highest degree of accuracy insofar as frequency stability when changes in supply voltage are concerned.

In the circuit of FIG. 4 the rectifier 44 is omitted, and hence the gate $10_2$ is not clamped to the supply voltage. The rectifier 46 is present so as to permit the capacitor 16 to charge in one direction through resistor 18 but not in the other direction. A constant current source *48a* is provided the gate 52 of which is connected to the movable tap 64 of a potentiometer 66 connected across Zener diode 68, the diode 68 being connected in series with Zener diode 70 between ground and drain $6_4$. Hence the constant current source 48 will be operatively energized when the drain $6_4$ is at negative potential but will be cut off when the drain $6_4$ is at ground potential. As a result constant current will be supplied to the capacitor 16 during the time that the valve 2 is conductive and the valve 4 is non-conductive but will not be supplied during the time that the valve 2 is non-conductive and the valve 4 is conductive. The amount of current delivered by the source *48a* to the capacitor 16 will be determined by the setting of the tap 64 on the potentiometer 66. Since the potentiometer 66 is connected cross the Zener diode 68 the voltage at the tap 64 will be independent of variations in supply votlage. Also $V_z$, the maximum negative voltage excursion of gate $10_2$ from the threshold voltage *v*, will be determined by Zener diodes 68 and 70, and hence will be independent of supply voltage variations. Those variations in supply voltage will, however, affect the slope of the lines 36, and they may also affect the threshold voltage 30.

Thus, as may be seen from FIGS. 4B and 4B′, because of the controlled and uniform constant current supplied to the capacitor 16 despite variations in the supply voltage, the time duration of that cyclic stage in which the voltage at gate $10_2$ is charging from its maximum negative voltage to the threshold voltage 30 is essentially constant. The only variations in this system which are produced by variations in supply voltage involve variations in the time duration of the other cyclic stage, in which the voltage of gate $10_2$ is discharging from ground toward the threshold voltage, as represented by the lines 36 and *36a* of FIG. 4B′. The error thus produced is rendered acceptable by making the time duration $T_1$ very small in relation to time duration $T_2$. Preferably $T_2$ is at least approximately 200 times $T_1$. The effect is that the change in $T_1$, designated $\Delta T_1$ in FIG. 1, is maintained at a minimal value. The desired relationship between $T_2$ and $T_1$ is achieved by making resistor 18 quite small, with a value, in a typical design, of 10,000 ohms.

Since in this embodiment the slope of the line 42 is not matched to the slope of the line 36, but is instead uniform desipte variations in supply voltage, the system is somewhat less accurate than the systems of FIGS. 2 and 3, but it nevertheless results in a significant increase in frequency stability when compared with prior art circuits.

Since the setting of the tap 64 on potentiometer 66 determines the amount of current provided by the current source *48a* during the charging of capacitor 16, and hence the slope of line 42, it also determines the duration of $T_2$. Hence control of the overall frequency of oscillation of the system is attained by the setting of the tap 64. With a capacitor 16 having a value of 0.3 mf. adjustment of the position of tap 64 can produce a frequency adjustment between 1 hertz and 10 hertz, in a typical design, without affecting frequency stability. In general the lower the value of the capacitor 16 the greater is the range over which frequency can be adjusted without adversely affecting frequency stability with changes in supply voltage.

FIG. 5 represents a variant of the circuit of FIG. 4 in which a source follower transistor 72 is connected in series with resistor 74 between the voltage source 14 and ground, with the gate $10_{72}$ of the source follower transistor being connected to the drain $6_2$ of the transistor 2. In this embodiment the rectifier 46 and resistor 18 are connected between the gate $10_2$ and the point 76 between the resistor 74 and the source $8_{72}$. This arrangement is employed where the drain resistors $12_2$ and $12_4$ have a high value of resistance, that being desirable in order to reduce the oscillator current drain. The purpose of the source follower 72 is to provide a low output impedance for the output signal and to provide the low driving impedance needed to limit $T_1$ to the small period of time required for accuracy of frequency stabilization. The operating characteristic of the circuit of FIG. 5 with changes in supply voltage is essentially that disclosed in FIGS. 4B and 4B′.

In the circuit of FIG. 6A the constant current source *48b* has its gate 78 connected to the tap 80 of a potentiometer 82 connected in series with Zener diode 84 between ground and the drain $6_4$. Otherwise the circuit is similar to that of FIG. 4A. Hence here again the constant current source *48b* linearizes and stabilizes the positive-going portion 42 of the waveform at gate $10_2$. However, in the embodiment of FIG. 6A the voltage at the potentiometer tap 80 will vary with changes in the supply voltage and hence, as indicated in FIG. 6B, the slopes of the lines 42 and *42a* under different conditions of supply voltage will vary, and hence the slopes of the lines 42 and *42a* will be varied to adjust for the small changes in the slopes of the lines 36 and *36a*. Here, unlike the embodiment of FIG. 4, the setting of the tap 80 will, within limits, provide for frequency stability with supply voltage changes and is not used as a frequency control. Thus a circuit corresponding to FIG. 6A yielded better than 0.1% frequency stability for a + or −30% voltage variation.

The circuits here disclosed will be seen to show various ways of so controlling the waveform on the gate $10_2$ of the basic multivibrator circuit as to produce periods of operation which are substantially constant, despite wide variations in supply voltage. The circuitry in question, when using field effect transistors as here specifically disclosed by way of exemplification, is exceptionally well adapted to be incorporated into integrated circuitry. Moreover, it has been found that the circuitry in question has the additional advantage of being highly insensitive to temperature variations, thus greatly enhancing its reliability and accuracy. Moreover, the fact that the monostable circuitry arrangement always starts in a predetermined state, with a given stage "on" and the other stage "off" is particularly advantageous in timing applications.

A number of different embodiments have been here specifically disclosed, and it will be apparent that many variations may be made therein, all within the scope of the invention as defined in the following claims.

I claim:

1. A multivibrator comprising first and second electronic valves each having a pair of output electrodes and a control electrode, the output electrodes of said valves being electrically connected to a voltage source in parallel, electrical connection means between the control electrode of each valve and an output electrode of the other valve, said electrical connection means being effective to cause the voltage at said control electrode of said second valve to vary in two cyclical stages first from an upper potential to a nominal potential and then from a lower potential to said nominal potential, the combined time duration of said two cyclical stages substantially determining the frequency of operation of said multivibrator, and means operatively connected to said control electrode of said second valve for causing the voltage at said control electrode to vary substantially linearly between said lower potential and said nominal potential at a controlled rate.

2. In the multivibrator of claim 1, means for causing said voltage at said control electrode of said second valve to vary substantially linearly as it varies from said upper potential to said nominal potential.

3. In the multivibrator of claim 2, means operatively connected to said control electrode for limiting said lower potential to a value substantially independent of the voltage of said voltage source.

4. In the multivibrator of claim 1, means operatively connected to said control electrode for limiting said lower potential to a value substantially independent of the voltage of said voltage source.

5. In the multivibrator of claim 1, adjustable means operatively connected to said control electrode for limiting said lower potential to an adjustable value substantially independent of the voltage of said voltage source.

6. In the multivibrator of claim 1, means for making the time duration of said first cyclical stage very much less than the time duration of said second cyclical stage.

7. In the multivibrator of claim 1, means for sensing the voltage of said voltage source, and means for varying said controlled rate of voltage variation substantially proportionally to said sensed voltage of said voltage source.

8. In the multivibrator of claim 7, means for causing said voltage at said control electrode of said second valve to vary substantially linearly as it varies from said upper potential to said nominal potential.

9. In the multivibrator of claim 7, means for making the time duration of said first cyclical stage very much less than the time duration of said second cyclical stage.

10. In the multivibrator of claim 7, in which said nominal voltage is the threshold operating voltage for said control electrode of said second valve, and means operatively connected to said control electrode of said second valve for limiting said lower potential to a value substantially independent of supply-voltage-variation-induced changes in said threshold voltage.

11. In the multivibrator of claim 7, means operatively connected to said control electrode of said second valve for limiting said lower potential to a value substantially proportional to the voltage of said voltage source.

12. The multivibrator of claim 7, in which said electric connection between said control electrode of said second valve and said output electrode of said first valve comprises a capacitor, and in which said means for causing said control voltage to vary linearly between said lower potential and said nominal potential comprises a constant current source operatively connected to said capacitor in a charging sense during said second cyclical stage.

13. The multivibrator of claim 7, in which said rate of variation of said voltage at said control electrode of said second valve as it goes from said lower potential to said nominal potential is substantially the same as, but opposite in sign from, the rate at which said control voltage varies from said upper potential to said nominal potential.

14. The multivibrator of claim 1, in which the rate of variation of said control voltage is substantially constant with variations in the voltage of said voltage source.

15. In the multivibrator of claim 14, means for causing said voltage at said control electrode of said second valve to vary substantially linearly as it varies from said upper potential to said nominal potential.

16. In the multivibrator of claim 14, means for making the time duration of said first cyclical stage very much less than the time duration of said second cyclical stage.

17. In the multivibrator of claim 14, means operatively connected to said control electrode for limiting said lower potential to a value substantially independent of the voltage of said voltage source.

18. In the multivibrator of claim 14, means operatively connected to said control electrode for limiting said lower potential to a value substantially independent of the voltage of said voltage source, and means for making the time duration of said first cyclical stage very much less than the time duration of said second cyclical stage.

19. In the multivibrator of claim 14, adjustable means operatively connected to said control electrode for limiting said lower potential to an adjustable value substantially independent of the voltage of said voltage source.

20. The multivibrator of claim 14, in which said electric connection between said control electrode of said second valve and said output electrode of said first valve comprises a capacitor, and in which said means for causing said control voltage to vary linearly between said lower potential and said nominal potential comprises a constant current source operatively connected to said capacitor in a charging sense during said second cyclical stage.

21. The multivibrator of claim 1, in which said rate of variation of said voltage at said control electrode of said second valve as it goes from said lower potential to said nominal potential is substantially the same as, but opposite in sign from, the rate at which said control voltage varies from said upper potential to said nominal potential.

22. The multivibrator of claim 1, in which said electric connection between said control electrode of said second valve and said output electrode of said first valve comprises a capacitor, and in which said means for causing said control voltage to vary linearly between said lower potential and said nominal potential comprises a constant current source operatively connected to said capacitor in a charging sense during said second cyclical stage.

23. In the multivibrator of claim 1, means operatively connected to said control electrode of said second valve for limiting said lower potential to a value substantially proportional to the voltage of said voltage source.

24. In the multivibrator of claim 1, in which said nominal voltage is the threshold operating voltage for said control electrode of said second valve, and means operatively connected to said control electrode of said second valve for limiting said lower potential to a value substantially independent of supply-voltage-variation-induced changes in said threshold voltage.

25. In the multivibrator of claim 1, means for causing said voltage at said control electrode of said second valve to vary substantially linearly as it varies from said upper potential to said nominal potential, said rate of variation of said voltage as it varies from said lower potential to said nominal potential being substantially the same as, but opposite in sign from, the rate at which said control voltage varies from said upper potential to said nominal potential, said nominal potential being the threshold operating voltage for said control electrode of said second valve, means operatively connected to said control electrode for limiting said lower potential to a value substantially independent of supply-voltage-variation-induced changes in said threshold voltage, said electric connection between said control electrode of said second valve and said output electrode of said first valve comprising a capacitor, and said means for causing said control voltage to vary linearly between said lower potential and said nominal potential comprising a constant current source operatively connected to said capacitor in a charging sense during said second cyclical stage.

26. In the multivibrator of claim 1, means for causing said voltage at said control electrode of said second valve to vary substantially linearly as it varies from said upper potential to said nominal potential, said nominal potential being the threshold operating voltage for said control electrode of said second valve, means operatively connected to said control electrode for limiting said lower potential to a value substantially independent of supply-voltage-variation-induced changes in said threshold voltage, said electric connection between said control electrode of said second valve and said output electrode of said first valve comprising a capacitor, and said means for causing said control voltage to vary linearly between said lower potential and said nominal potential comprising a constant current source operatively connected to said capacitor in a charging sense during said second cyclical stage.

27. In the multivibrator of claim 1, means for causing said voltage at said control electrode of said second valve to vary substantially linearly as it varies from said upper potential to said nominal potential, said rate of variation of said voltage as it varies from said lower potential to said nominal potential being substantially the same as, but opposite in sign from, the rate at which said control voltage varies from said upper potential to said nominal potential, said nominal potential being the threshold operating voltage for said control electrode of said second valve, and means operatively connected to said control electrode for limiting said lower potential to a value substantially independent of supply-voltage-variation-induced changes in said threshold voltage.

28. In the multivibrator of claim 1, means for causing said voltage at said control electrode of said second valve to vary substantially linearly as it varies from said upper potential to said nominal potential, said nominal potential being the threshold operating voltage for said control electrode of said second valve, and means operatively connected to said control electrode for limiting said lower potential to a value substantially independent of supply-voltage-variation-induced changes in said threshold voltage.

29. The multivibrator of claim 1, in which said rate of variation of said voltage as it varies from said lower potential to said nominal potential is substantially the same as, but opposite in sign from, the overall rate at which said control voltage varies from said upper potential to said nominal potential, said nominal potential being the threshold operating voltage for said control electrode of said second valve, means operatively connected to said control electrode for limiting said lower potential to a value substantially independent of supply-voltage-variation-induced changes in said threshold voltage, said electric connection between said control electrode of said second valve and said output electrode of said first valve comprising a capacitor, and said means for causing said control voltage to vary linearly between said lower potential and said nominal potential comprising a constant current source operatively connected to said capacitor in a charging sense during said second cyclical stage.

30. The multivibrator of claim 1, in which said rate of variation of said voltage as it varies from said lower potential to said nominal potential is substantially the same as, but opposite in sign from, the overall rate at which said control voltage varies from said upper potential to said nominal potential, said electric connection between said control electrode of said second valve and said output electrode of said first valve comprising a capacitor, and said means for causing said control voltage to vary linearly between said lower potential and said nominal potential comprising a constant current source operatively connected to said capacitor in a charging sense during said second cyclical stage.

31. The multivibrator of claim 1, in which said rate of variation of said voltage as it varies from said lower potential to said nominal potential is substantially the same as, but opposite in sign from, the overall rate at which said control voltage varies from said upper potential to said nominal potential, said nominal potential being the threshold operating voltage for said control electrode of said second valve, and means operatively connected to said control electrode for limiting said lower potential to a value substantially independent of supply-voltage-variation-induced changes in said threshold voltage.

32. In the multivibrator of claim 1, means for causing said voltage at said control electrode of said second valve to vary substantially linearly as it varies from said upper potential to said nominal potential, said rate of variation of said voltage as it varies from said lower potential to said nominal potential being substantially the same as, but opposite in sign from, the rate at which said control voltage varies from said supper potential to said nominal potential.

33. In the multivibrator of claim 1, means for causing said voltage at said control electrode of said second valve to vary substantially linearly as it varies from said upper potential to said nominal potential, said electric connection between said control electrode of said second valve and said output electrode of said first valve comprising a capacitor, and said means for causing said control voltage to vary linearly between said lower potential and said nominal potential comprising a constant current source operatively connected to said capacitor in a charging sense during said second cyclical stage.

34. In the multivibrator of claim 1, means for causing said voltage at said control electrode of said second valve to vary substantially linearly as it varies from said upper potential to said nominal potential, said rate of variation of said voltage as it varies from said lower potential to said nominal potential being substantially the same as, but opposite in sign from, the rate at which said control voltage varies from said upper potential to said nominal potential, said electric connection between said control electrode of said second valve and said output electrode of said first valve comprising a capacitor, and said means for causing said control voltage to vary linearly between said lower potential and said nominal potential comprising a constant current source operatively connected to said capacitor in a charging sense during said second cyclical stage.

35. In the multivibrator of claim 1, said nominal potential being the threshold operating voltage for said control electrode of said second valve, means operatively connected to said control electrode for limiting said lower potential to a value substantially independent of supply-voltage-variation-induced changes in said threshold voltage, said electric connection between said control electrode of said second valve and said output electrode of said first valve comprising a capacitor, and said means for causing said control voltage to vary linearly between said lower potential and said nominal potential comprising a constant current source operatively connected to said capacitor in a charging sense during said second cyclical stage.

No references cited.

JOHN KOMINSKI, Primary Examiner

U.S. Cl. X.R.

307—291, 304; 331—111